US006489239B1

(12) United States Patent
Jang et al.

(10) Patent No.: US 6,489,239 B1
(45) Date of Patent: Dec. 3, 2002

(54) METHOD OF TUNGSTEN CHEMICAL VAPOR DEPOSITION AND TUNGSTEN PLUG FORMATION

(75) Inventors: Woo Sung Jang; Cheol Ho Lee, both of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 54 days.

(21) Appl. No.: 09/724,151

(22) Filed: Nov. 28, 2000

(30) Foreign Application Priority Data

Dec. 6, 1999 (KR) ............................................ 99-55254

(51) Int. Cl.$^7$ ............................................... H01L 21/44
(52) U.S. Cl. ........................ 438/680; 438/674; 438/685
(58) Field of Search ................................. 438/685, 680, 438/674

(56) References Cited

U.S. PATENT DOCUMENTS

| | | | | |
|---|---|---|---|---|
| 5,489,552 A | | 2/1996 | Merchant et al. ............ | 437/192 |
| 5,953,630 A | | 9/1999 | Maeda et al. ................ | 438/680 |
| 6,136,690 A | * | 10/2000 | Li ............................... | 438/680 |
| 6,245,654 B1 | * | 6/2001 | Shih et al. ................... | 438/685 |
| 6,268,289 B1 | * | 7/2001 | Chowdhury et al. ......... | 438/687 |
| 6,309,966 B1 | * | 10/2001 | Govindarajan et al. ...... | 438/685 |
| 6,352,924 B1 | * | 3/2002 | Wu et al. ..................... | 438/685 |

FOREIGN PATENT DOCUMENTS

JP             08213344            2/1995

* cited by examiner

Primary Examiner—Jey Tsai
Assistant Examiner—Lynne Gurley
(74) Attorney, Agent, or Firm—Mills & Onello LLP

(57) ABSTRACT

The present invention relates to a tungsten chemical vapor deposition method and a method for forming a tungsten plug. The tungsten chemical vapor deposition method of the present invention includes preparing a wafer where a barrier layer is formed. Silane gas is supplied from each of a top of the wafer and a bottom of an edge part of the wafer toward the wafer simultaneously, in order to form a silicon passivation thin film on the top surface and the edge part of the wafer; in order to form a tungsten nucleation on the top surface of the wafer where the passivation thin film is formed. A mixed gas including a tungsten fluoride gas and a silane gas is supplied from the top of the wafer toward the wafer, and at the same time a silane gas is supplied from the bottom of the edge part toward the wafer. A mixed gas including a tungsten fluoride gas and a hydrogen gas is supplied from the top of the wafer toward the wafer, in order to deposit a sufficiently thick tungsten on the surface of the wafer. Therefore, the present invention can prevent a fluoride ion generated during a tungsten deposition process from reacting with the barrier layer at the edge part by passivating not only the top surface of the wafer but also the edge part with the silane gas at the initial step of the tungsten deposition process.

20 Claims, 11 Drawing Sheets

METHOD OF TUNGSTEN CHEMICAL VAPOR DEPOSITION AND TUNGSTEN PLUG FORMATION

BACKGROUND OF THE INVENTION

1. Field of the Invention

The present invention relates to a tungsten chemical vapor deposition method and a method for forming a tungsten plug, and more specifically, to a tungsten chemical vapor deposition method and a method for forming a tungsten plug capable of preventing a fluoride ion generated during a tungsten deposition process from reacting with the barrier layer at an edge portion.

2. Description of the Related Art

An aspect ratio of a contact hole or a via hole, i.e., the ratio of the length of a hole to its diameter, is increased as the size of the device in which it is formed is miniaturized by high integration of the device. Since contact holes or via holes cannot be formed reliably using the conventional aluminum deposition technology, a tungsten plug is commonly formed in a contact hole or in a via hole using tungsten chemical vapor deposition (CVD).

In general, a tungsten plug is formed by first forming a first conductive layer on a wafer and then covering the surface with a flat insulation layer. After forming a contact hole or a via hole on the insulation layer, a Ti/TiN barrier layer is blanket deposited on the wafer. Then, tungsten is deposited on the barrier layer to a sufficient thickness such that the contact hole or the via hole can be sufficiently buried by tungsten CVD. A tungsten plug is formed in the contact hole or in the via hole by polishing the surface of the deposited tungsten layer to make the layer flat using an etchback process or chemical mechanical polishing method until the surface of the insulation layer is exposed.

When using the tungsten CVD process to form the tungsten plug, there occurs a volcano phenomenon as set forth in U.S. Pat. No. 5,489,552, incorporated herein in its entirety by reference. That is, in a tungsten CVD, tungsten is deposited on the surface of the Ti/TiN barrier layer by reducing a tungsten fluoride gas with a silane gas or a hydrogen gas. At this time, TiFx vapors are generated by such that a fluoride ion generated by the reduction reaction reacts with Ti of the bottom layer through a pin hole on the TiN layer forming the barrier layer, and as the volume of the Ti layer increases by the reaction, the Ti layer penetrates the top layer, and a defect occurs similar in shape to a volcano eruption.

To solve said problem, U.S. Pat. No. 5,489,552 discloses a technology preventing the volcano phenomenon by blocking the fluoride ion generated in the succeeding reaction process from reacting with the bottom film by annealing the surface of the barrier layer or by applying a passivation to the surface of the TiN layer with a silane gas at a flow rate ranging from 75 to 300 SCCM for from 25 to 150 seconds at the CVD initial step.

On the other hand, the tungsten deposited by the tungsten CVD method is removed by an etchback method or by the CMP method. The removal of the tungsten formed on the edge part of the wafer is readily accomplished using the etchback method, but in the CMP method it is difficult to remove the tungsten deposited on the edge part, that is, on the side or on the back surface because only the top surface of the wafer is polished. The residue on the edge part is dropped in the succeeding process and contaminates the facility or acts as a contaminant.

In Japanese Pat. Publication No. 8-213344 is disclosed a ring clamp covering the edge part in order to prevent a reaction gas from contacting directly in order to prevent in advance the creation of a tungsten residue remaining on the edge part of the wafer when forming a tungsten plug. The Japanese publication also discloses a technology of supplying a fluoride gas capturing gas like an ethylene CH2 toward the edge part of the wafer from the bottom of the edge part.

In U.S. Pat. No. 5,953,630, incorporated herein in its entirety, is disclosed a technology of forming a passivation film on the edge part by supplying a purge gas including halides such as $NF_3$, $C_2F_6$, $Cl_2$, $F_2$, $ClF_3$ and $BCl_3$ toward the edge part of the wafer from the bottom of the edge part of the wafer.

If the deposition of tungsten on the edge part of the wafer in a tungsten CVD process is not prevented actively, the barrier layer is lifted by the volcano phenomenon generated on the edge part, and the reaction continues to proceed toward the center of the wafer along the lifted interface and results in generating a device defect and in reducing the yield.

SUMMARY OF THE INVENTION

It is an object of the present invention to provide a tungsten chemical vapor deposition method and a method for forming a tungsten plug which can prevent a fluoride ion generated during a tungsten deposition process from reacting with the barrier layer at the edge part by applying a passivation not only to the top surface of the wafer but also to the edge part with silane gas at the initial step of the tungsten deposition process.

To accomplish the above object, a chemical vapor deposition method of the present invention includes forming a tungsten layer on a wafer having a top surface and a peripheral edge portion. A silane gas is supplied to each of the top surface and the edge portion of the wafer before the deposition of tungsten, in order to form a silicon passivation thin film on the top surface and on the edge portion of the wafer to prevent a fluoride ion generated in reaction from penetrating into a bottom layer through a pin hole.

In another aspect, the deposition method of the present invention includes preparing a wafer where a barrier layer is formed. Silane gas is supplied from a top of the wafer and from a bottom of an edge portion toward the wafer simultaneously, in order to form a silicon passivation thin film on the top surface and the edge portion of the wafer. In order to form a tungsten nucleation on the top surface of the wafer where the passivation thin film is formed, a mixed gas including a tungsten fluoride gas and a silane gas is supplied from the top of the wafer toward the wafer, and at the same time silane gas is supplied from the bottom of the edge portion toward the wafer. A mixed gas including a tungsten fluoride gas and a hydrogen gas is supplied from the top of the wafer toward the wafer, in order to deposit a sufficiently thick tungsten on the surface of the wafer.

In another aspect, the invention is directed to a method for forming a tungsten plug in a semiconductor device. A hole is formed on an insulation layer on a wafer, and a titanium thin film is deposited with a uniform thickness on the resulted structure. A titanium nitride film is deposited with a uniform thickness on the titanium thin film. A silicon passivation thin film is formed on the titanium nitride film by supplying silane gas to each of a top surface and an edge portion of a wafer deposited with the titanium nitride film. A tungsten nucleation is formed on the top surface of the wafer as supplying silane gas to each of the top surface and the edge portion of the wafer where the silicon passivation thin film is formed. Tungsten is deposited on the top surface of the wafer where the tungsten nucleation is formed, in order for the hole to be filled sufficiently.

In one embodiment, it is desirable to form the silicon passivation thin film with a thickness of at least about 10 angstroms by supplying the silane gas supplied to form the silicon passivation thin film at a flow rate ranging from 30 to 50 SCCM for about 5 or 30 seconds in a vacuum chamber maintaining the temperature of about 415 degrees C. and the pressure of about 40 Torr. That is, it is sufficient to be as thick as to fill in a pin hole of the barrier layer.

In one embodiment, the final thickness of the deposited tungsten is about 4,000 angstroms.

In one embodiment, the wafer is clamped with a ring clamp for preventing a tungsten fluoride gas from contacting directly with the edge part of the wafer.

The present invention can prevent a fluoride gas generated in a tungsten deposition process of a succeeding process from penetrating into a titanium thin film through a titanium nitride film on the edge part of the wafer by applying passivation to not only the top surface but also to the edge part of the wafer, in an initial step of the tungsten deposition process. Therefore, the present invention can improve the yield and the reliability since the volcano phenomenon, which occurs on the edge part and proceeds toward the center of the wafer, can be prevented as the reaction of the titanium and the fluoride gas is stopped.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Preferred embodiments of the present invention will be described in detail with reference to the accompanying drawings.

In general, a wafer in a wafer cassette is sent to a loadlock chamber through a loading and unloading device. In the loadlock chamber, the wafer is installed on a susceptor of a process chamber through a robot sender.

Figure 1:
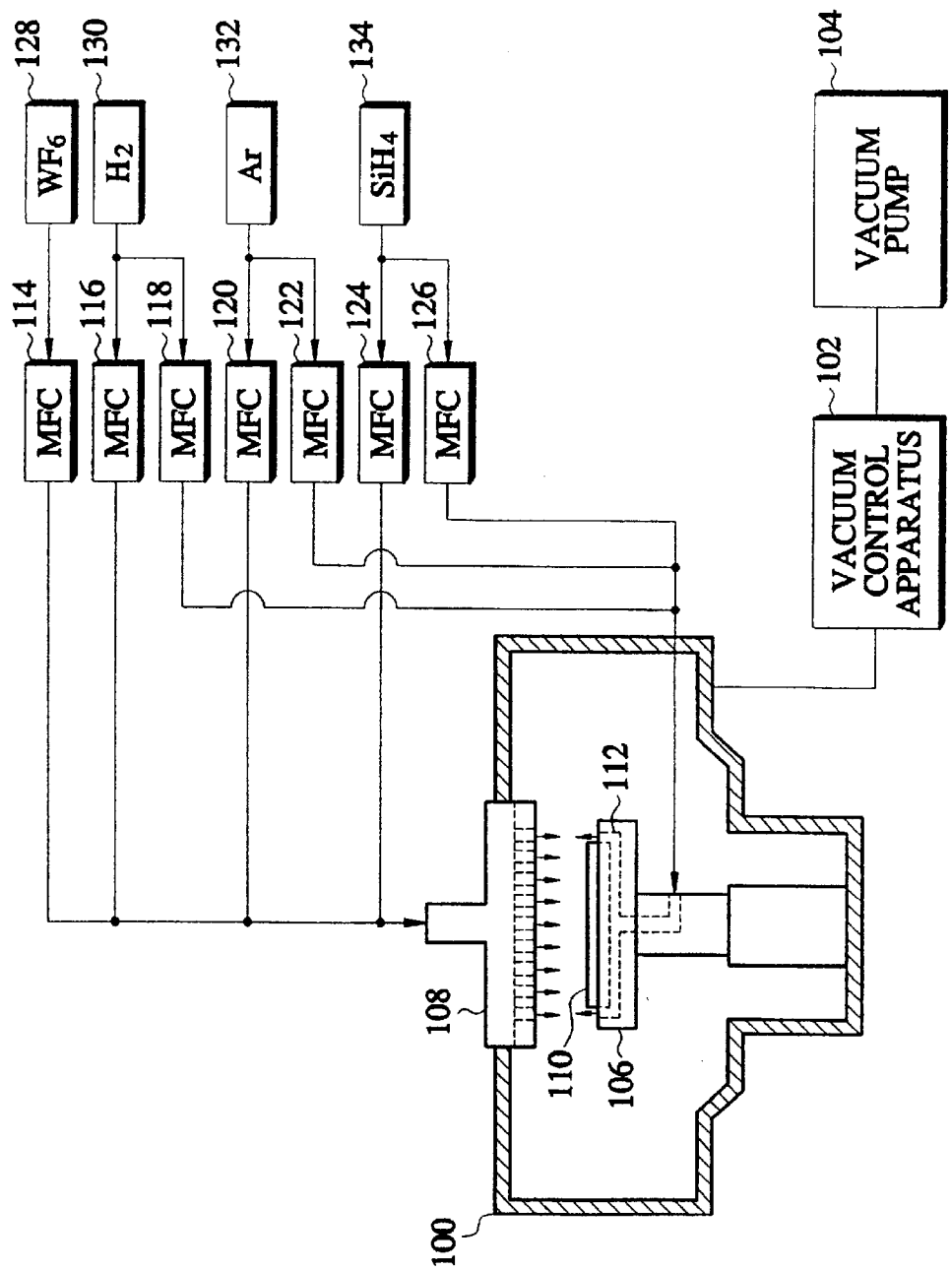
FIG. 1 is a schematic block diagram illustrating a tungsten chemical vapor deposition apparatus in accordance with the present invention.

FIG. 1 is an schematic block diagram illustrating a process chamber of a CVD apparatus in accordance with the present invention. In FIG. 1, a process chamber 100 is connected to a vacuum pump 104 via a vacuum control apparatus 102. A susceptor 106 where a wafer is installed and a shower head 108 installed on top of the susceptor 106 are included in the process chamber 100.

An inflow tube 112 for supplying a process gas to an edge part of a wafer 110 is installed in the susceptor 106. Process gases such as hydrogen gas 130, argon gas 132 and silane gas 134 are flowed into the inflow tube 112 via mass flow controllers MFC 118, 122 and 126, respectively. Process gases such as tungsten fluoride gas 128, hydrogen gas 130, argon gas 132 and silane gas 134 are flowed into the shower head 108 via MFCs 114, 116, 120 and 124, respectively.

Figure 2:
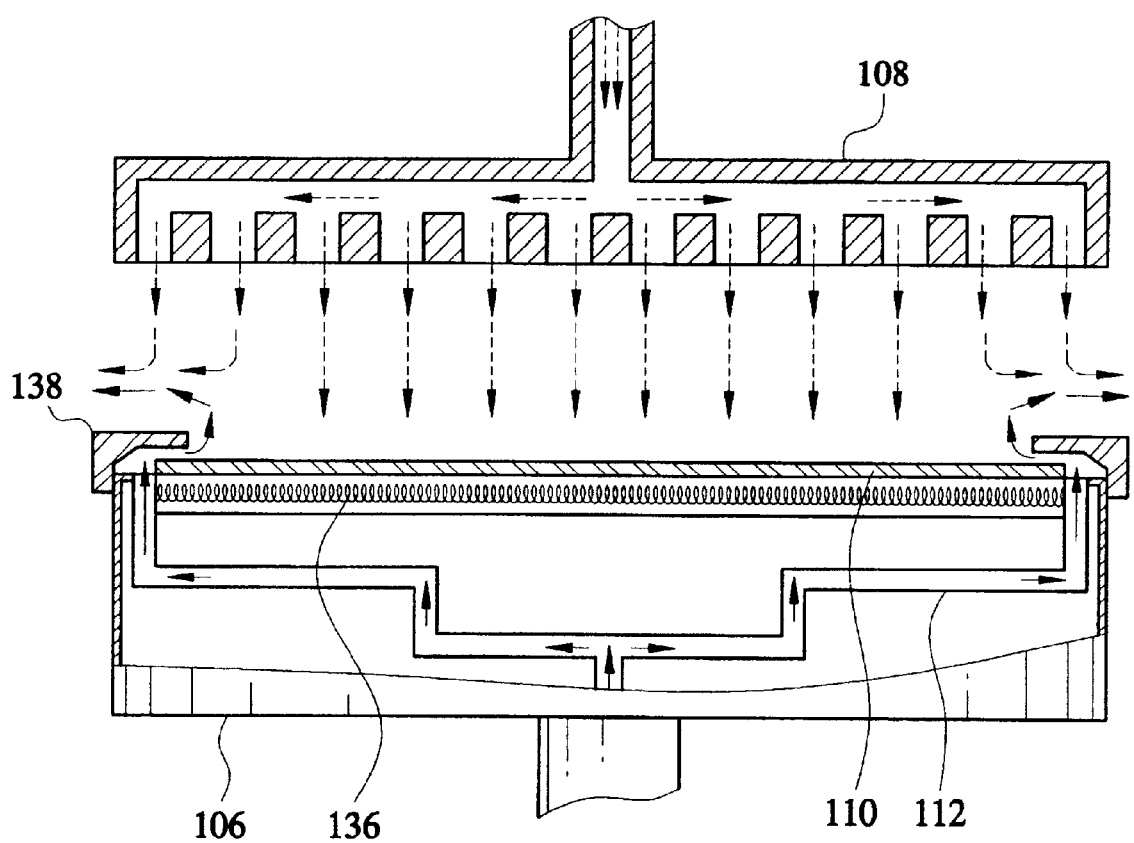
FIG. 2 is a schematic cross-sectional view showing a susceptor with a ring clamp of a tungsten CVD apparatus in accordance with the present invention.
Figure 3:
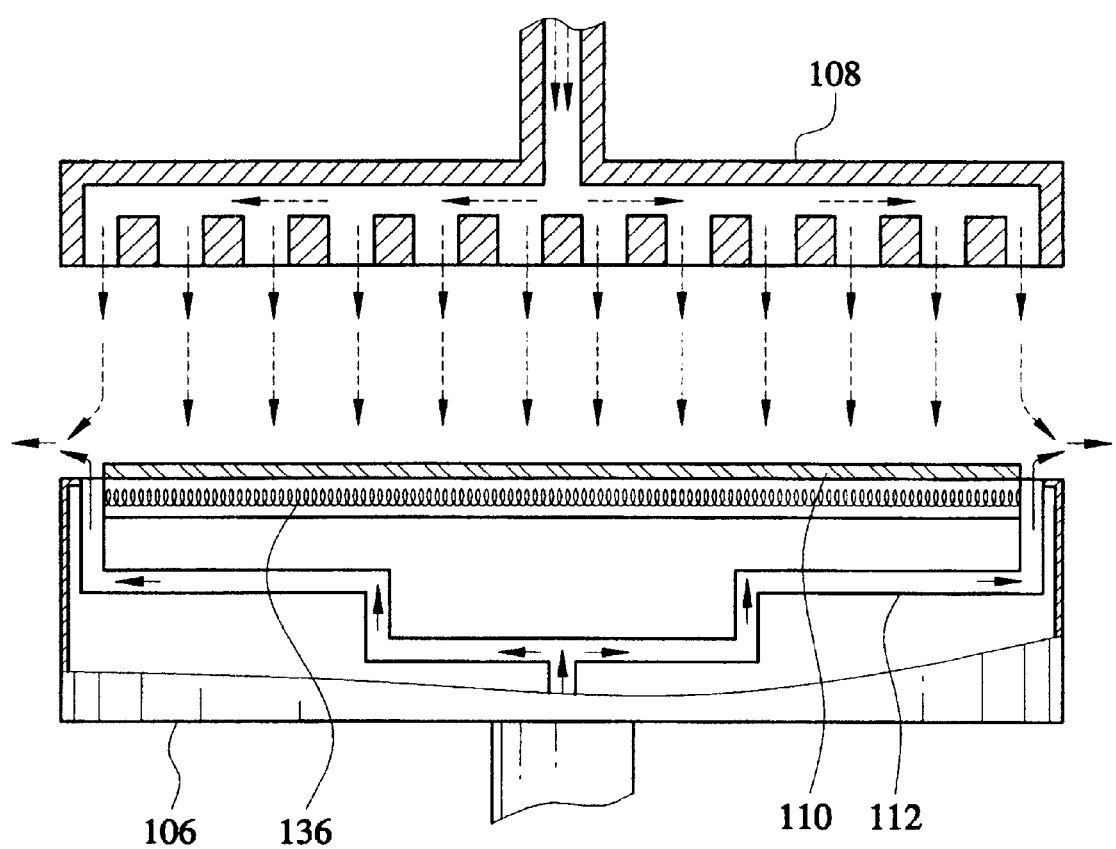
FIG. 3 is a schematic cross-sectional view showing a susceptor without a ring clamp of a tungsten CVD apparatus in accordance with the present invention.

FIG. 2 shows a ring clamp method of a susceptor of a CVD apparatus in accordance with the present invention, and FIG. 3 shows a method without a ring clamp of a susceptor of a CVD apparatus of the present invention. The ring clamp method, as compared with the method without a ring clamp, comprises the inflow tube 112 and a heater 136 similar to the method without a ring clamp but further comprises a ring clamp 138 to clamp the wafer 110. Therefore, the process gas supplied toward the edge part of the wafer 110 among process gases supplied toward the bottom from the shower head 108 is prevented from direct contact with the edge of the wafer because it is blocked by the ring clamp 138.

Also, the process gas flowed into the edge part of the wafer through the space between the ring clamp 138 and the wafer 110 is prevented from flowing into the edge portion of the wafer by the process gas supplied toward the top from the inflow tube of the susceptor 106.

The approach without a ring clamp, wherein a tungsten fluoride gas is supplied directly to the edge portion of the wafer from the shower head, can suppress the tungsten fluoride gas supplied toward the side or the back surface by the supply gas supplied from the bottom.

In the ring clamp approach, since there is no tungsten deposited on the side or on the back surface after the deposition of a tungsten, it is desirable to polish a surface with a CMP process, and in the approach without a ring clamp it is desirable to planarize the surface with an etch-back method.

Figure 4:
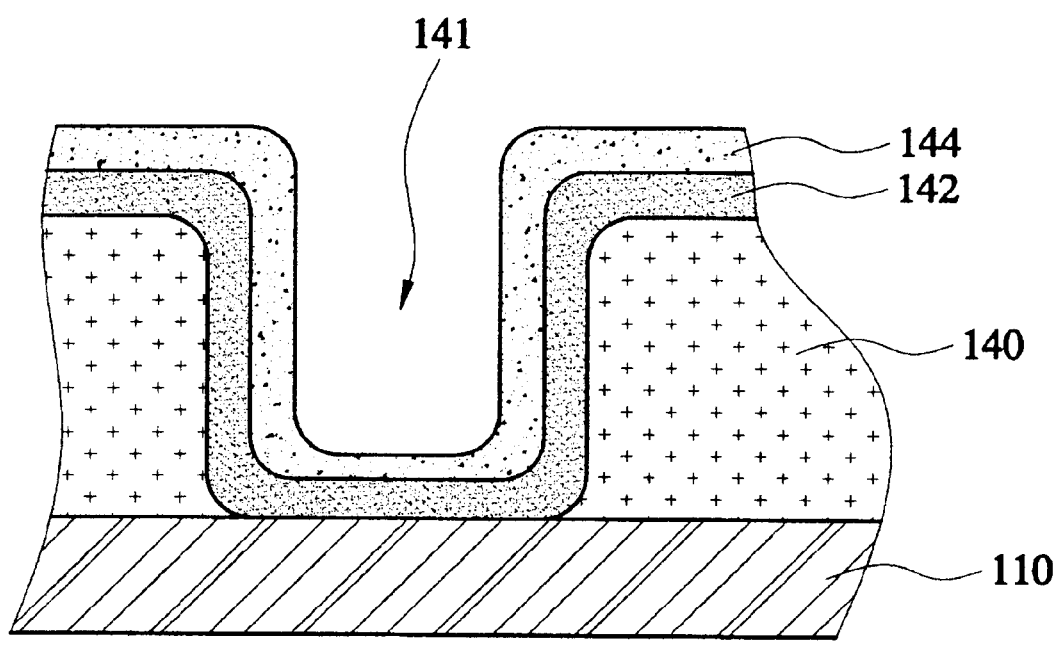
FIG. 4 through FIG. 7 are schematic cross sectional diagrams of a device showing the process of forming a tungsten plug in the device in accordance with the present invention.

Tungsten CVD processes in accordance with the present invention are described as follows with reference to FIG. 4 through FIG. 11. As shown in FIG. 4, a contact hole or a via hole 141 is formed on an insulation layer 140 formed on a wafer 110. Then, a titanium thin film 142 is formed on the wafer 110 by depositing Ti with a uniform thickness of about 100 angstroms using a sputteringmethod, and then a titanium nitride film 144 is formed by depositing TiN with a uniform thickness of about 300 angstroms. using the sputtering method. These two films are provided as a barrier layer.

Figure 8:
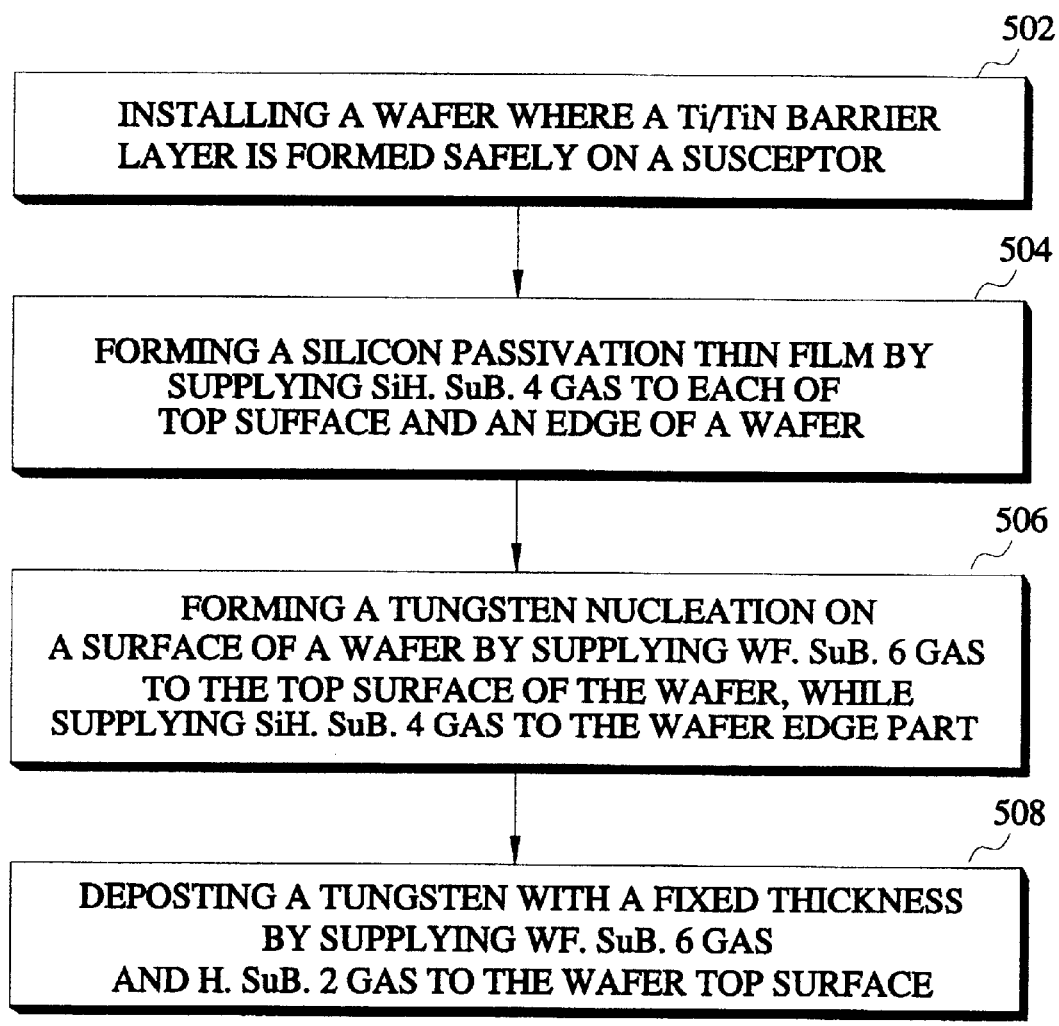
FIG. 8 is a flow chart illustrating a tungsten CVD method in accordance with the present invention.

The wafer where a barrier layer is formed is installed in a susceptor in a process chamber of a tungsten CVD apparatus. That is, a tungsten CVD method in accordance with the present invention as shown in FIG. 8, after preparing a wafer where a barrier layer is to be formed in step 502, supplies silane gas from each of the top of the wafer and the bottom of the edge part toward the wafer simultaneously in order to form a silicon passivation thin film on the top surface and the edge part of the wafer, in step 504. In step 506, a mixed gas including a tungsten fluoride gas and a silane gas is supplied from the top of the wafer toward the wafer and at the same time a silane gas is supplied from the bottom of the edge part toward the wafer in order to form a tungsten nucleation on the top surface of the wafer where the passivation thin film is formed. In step 508, a mixed gas including a tungsten fluoride gas and a hydrogen gas is supplied from the top of the wafer toward the wafer, in order to deposit a sufficiently thick tungsten on the surface of the wafer.

In one specific exemplary embodiment, a wafer is heated to a temperature of about 415 degrees C. through a heater of the susceptor while maintaining the process chamber 100 in a vacuum state of about 450 Torr pressure by exhausting the air in the process chamber 100 with a vacuum pump. Then, at the initial step, an argon and hydrogen gas at a flow rate of about 9,000 SCCM and a silane gas at a flow rate of 30–50 SCCM are mixed for about 5 seconds and are supplied to the wafer 110 simultaneously through the shower head 108 and the inflow tube 112.

Figure 5:
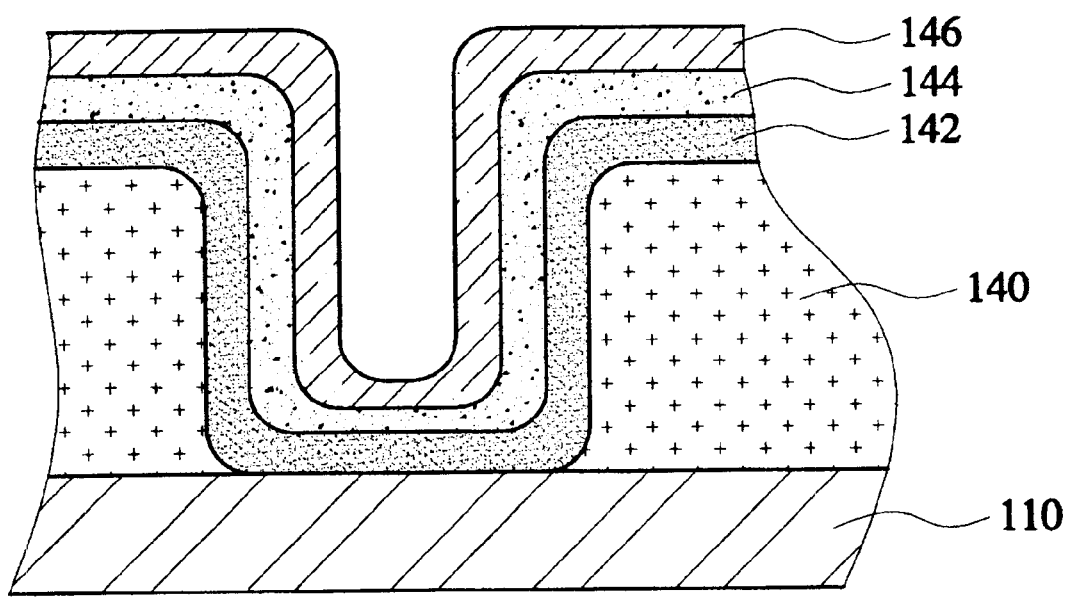
Figure 9:
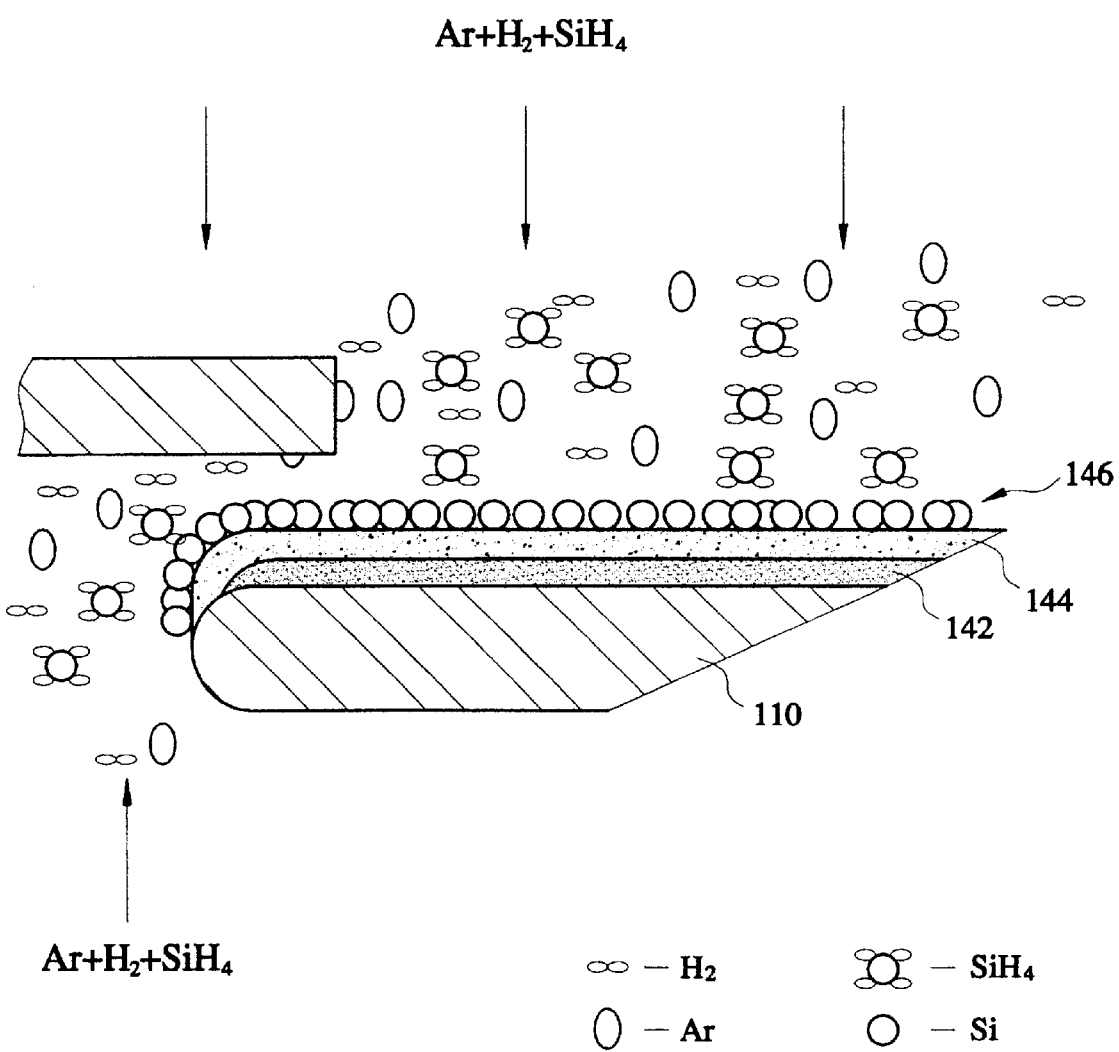
FIG. 9 is a drawing showing the procedure of forming a silicon passivation thin film in accordance with the present invention.

Therefore, as shown in FIG. 5 and FIG. 9, a silicon passivation thin film 146 is formed with the thickness of about 10 angstroms on the surface of the titanium nitride film 144 by the silane gas provided on the top surface and the edge part of the wafer. That is, as shown in FIG. 9, the silicon passivation thin film 146 is formed by silicon molecules pyrolyzed from the silane gas absorbed on the surface of the titanium nitride film 144 on the top surface and edge part of the wafer. The silicon passivation thin film 146 plays a role of filling up the pin hole of the titanium nitride film 144 and preventing the fluoride gas generated in the succeeding process from penetrating into the titanium thin film 142 on the bottom.

Figure 6:
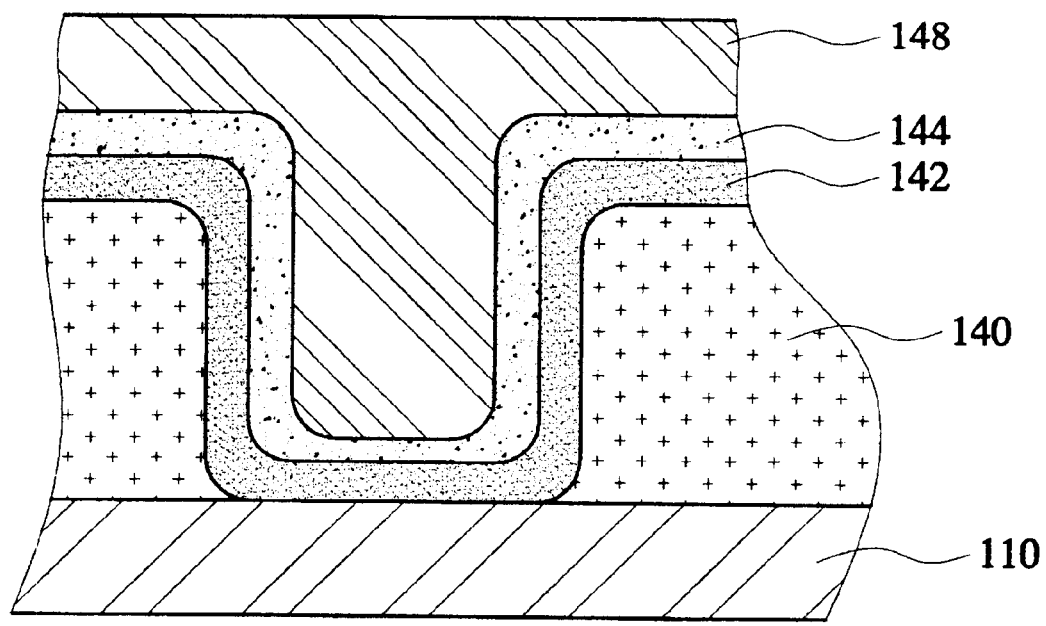
Figure 10:
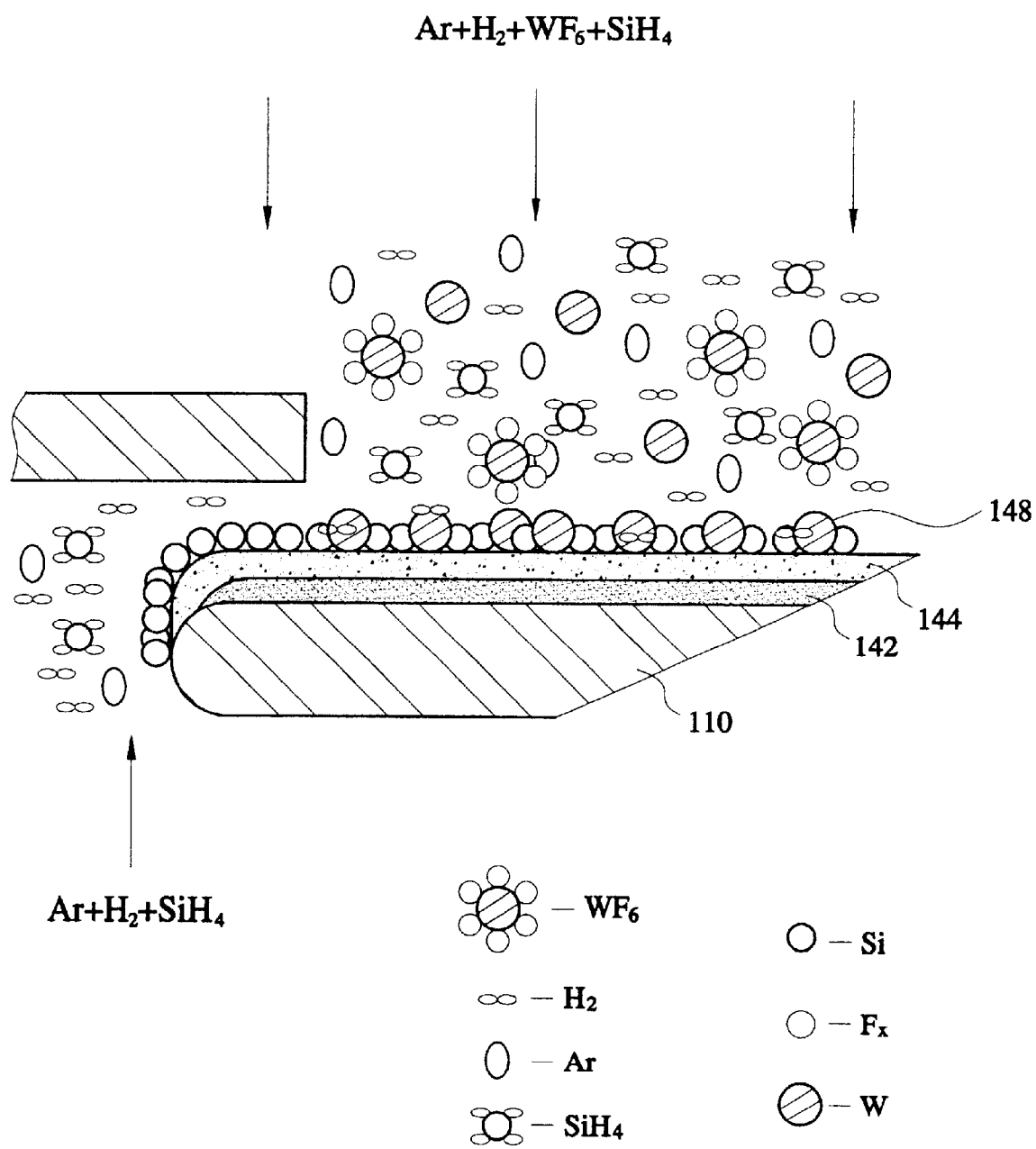
FIG. 10 is a drawing showing the procedure of tungsten nucleation formation in accordance with the present invention.

Referring to FIG. 6 and FIG. 10, in order to form a tungsten nucleation after said initial step is executed, an argon and hydrogen gas at a flow rate of about 9,000 SCCM and a silane gas at a flow rate of 30–50 SCCM are mixed for about 12 seconds through a shower head 108 and an inflow tube 112 and are supplied to the wafer where a silicon passivation thin film 146 is formed through the shower head 108 and the inflow tube 112, and at the same time a tungsten fluoride gas at a flow rate ranging from 300 to 350 SCCM is further added and supplied through the shower head 108. Therefore, on the top surface of the wafer, the tungsten fluoride gas is reduced by silicon of the silicon passivation thin film 146 and the tungsten and the silicon are replaced and a tungsten nucleation is generated on the surface of the titanium nitride film 144 by the following chemical equation.

$$2WF_6(g)+3Si(s)=2W(s)+3SiF_6(g) \tag{1}$$

But, on the edge part of the wafer, the formation of a tungsten nucleation is suppressed because the inflow of the tungsten fluoride gas is disturbed by the process gas, that is, a mixed gas of hydrogen, argon and silane supplied from the ring clamp and the inflow tube on the bottom toward the top.

After the tungsten nucleation is formed as about 12 seconds has passed, the supply of the silane gas through the inflow tube and the shower head is stopped and the remaining gases are supplied continuously for a constant time.

Figure 11:
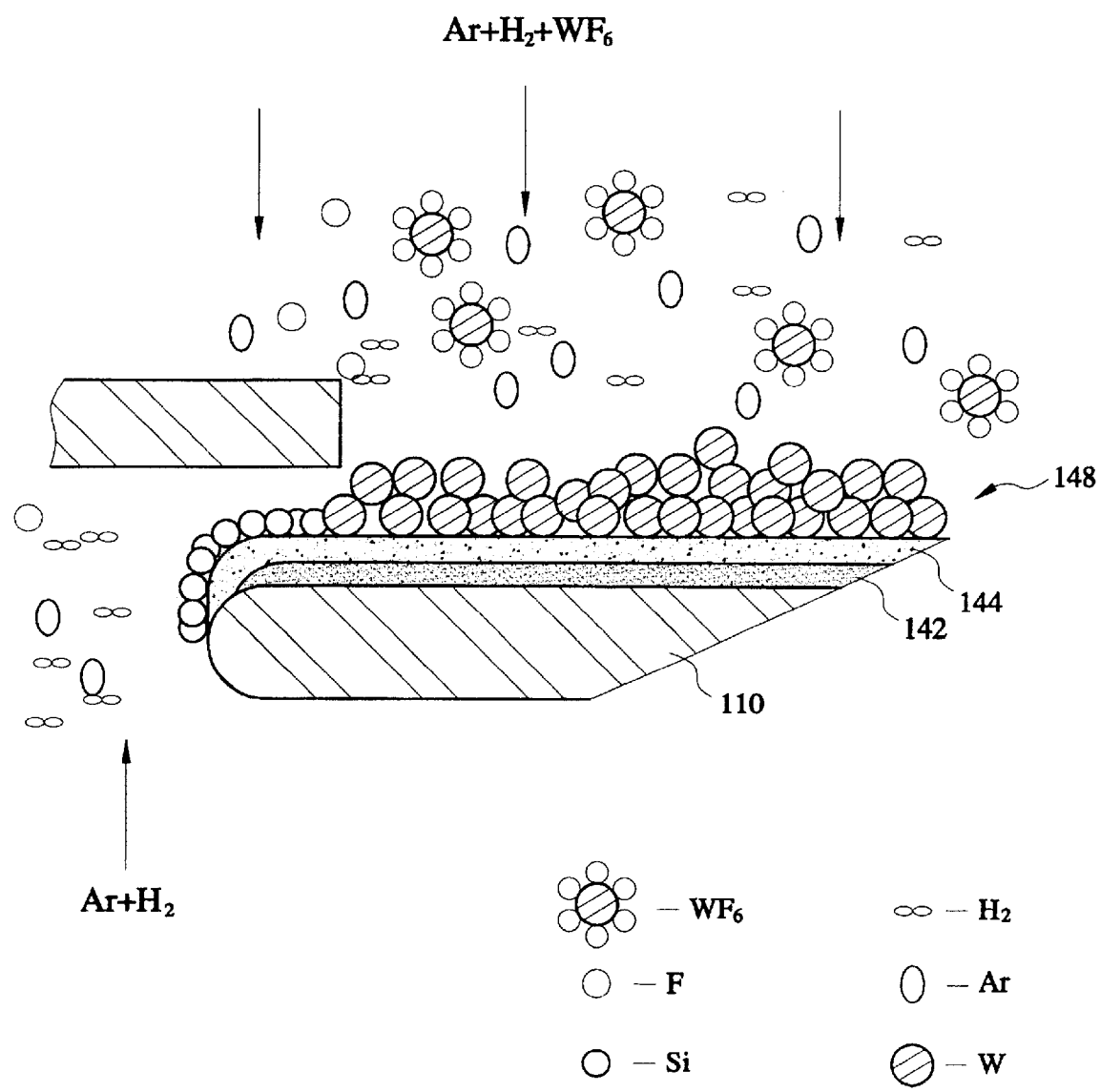
FIG. 11 is a drawing showing the deposition process of a tungsten layer in accordance with the present invention.

From then, as shown in the next chemical equation 2, tungsten is deposited on the tungsten nucleation by the hydrogen reduction as shown in FIG. 11.

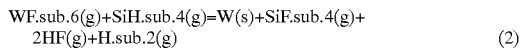
$$WF_6(g)+SiH_4(g)=W(s)+SiF_4(g)+2HF(g)+H_2(g) \tag{2}$$

The deposition of the tungsten by the hydrogen reduction is repeated periodically for a constant time and is maintained until the via hole or the contact hole is filled up fully, that is, filled up sufficiently.

In said hydrogen reduction tungsten deposition step, a fluoride gas is generated inevitably and the fluoride gas does not penetrate into the bottom film of the titanium thin film 142 since pin holes of the titanium nitride film 144 are blocked by the previously deposited tungsten layer on the top surface of the wafer. Also, on the edge part, that is, on the side of the wafer, there is no deposited tungsten, but since pin holes of the titanium nitride film 144 are blocked by the silicon passivation thin film 146 formed at the above-mentioned initial step, the fluoride gas can not penetrate into the bottom film of the titanium thin film 142. At this time, the inflow of gases supplied to the edge part from the shower head is suppressed or prevented by that the hydrogen and argon gas are supplied toward the top through the inflow tube.

Finally, a tungsten layer 148 with the thickness of about 4,000 angstroms in FIG. 6 is formed by proceeding with the tungsten deposition by the tungsten hydrogen reduction continuously in the state of increasing finally the temperature of the wafer from 415 degrees C. to 475 degrees C.

Figure 7:
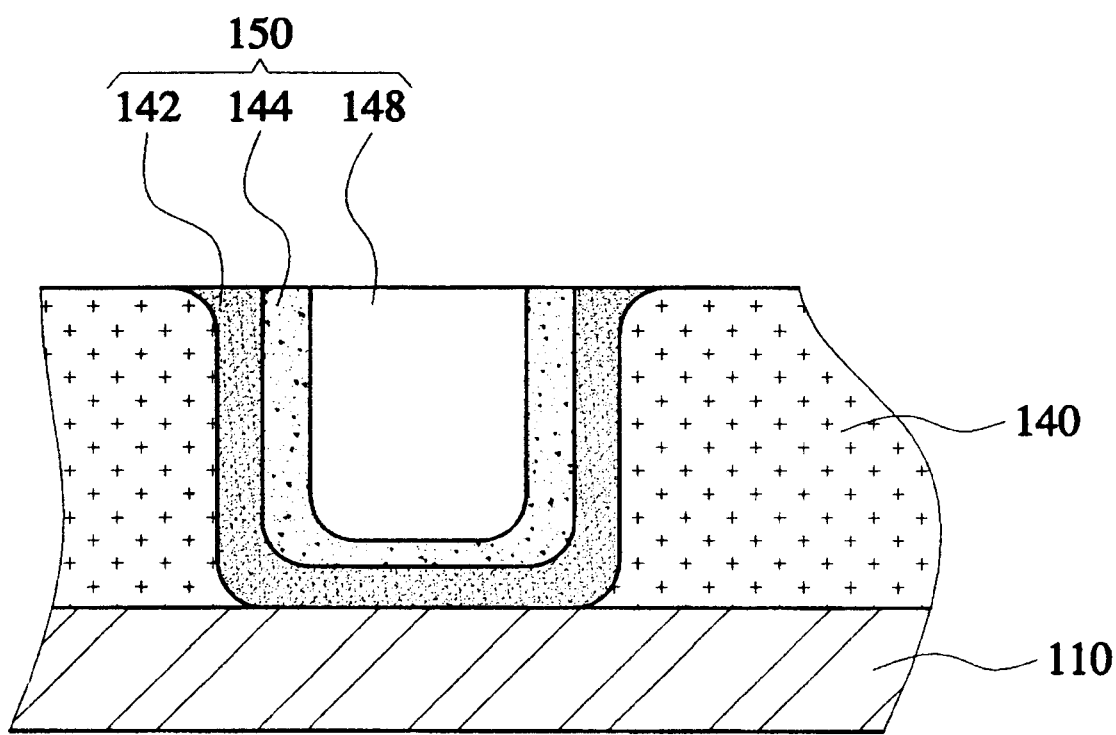

As shown in FIG. 7, when the tungsten deposition is completed, the surface is planarized in order for the insulation layer on the bottom to be revealed by polishing the tungsten layer 148 with the CMP process or the etchback process. Then, a tungsten plug 150 is left only in the via hole or contact hole.

As mentioned above, the present invention can prevent a fluoride gas generated in a tungsten deposition process of a succeeding process from penetrating into a titanium thin film through a titanium nitride film on the edge part of the wafer by passivation not only the top surface but also the edge part of the wafer, in an initial step of the tungsten deposition process. Therefore, the present invention can improve the yield and the reliability since the volcano phenomenon, which occurs on the edge part and proceeds toward the center of the wafer, can be prevented as the reaction of the titanium and the fluoride gas is stopped.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A tungsten chemical vapor deposition method, comprising:

forming a tungsten layer on a wafer having a top surface and a peripheral edge portion; and supplying a silane gas to each of the top surface and the edge portion of said wafer before the deposition of tungsten, in order to form a silicon passivation thin film on the top surface and on the edge portion of said wafer to prevent a fluoride ion generated in reaction from penetrating into a bottom layer through a pin hole.

2. The tungsten chemical vapor deposition method according to claim 1, further comprising supplying an argon gas and a hydrogen gas with said silane gas.

3. The tungsten chemical vapor deposition method according to claim 2, further comprising supplying the silane gas at a flow rate ranging from 30 to 50 SCCM and an argon gas and a hydrogen gas at a flow rate of about 9,000 SCCM for about 5 seconds in a vacuum chamber maintaining the temperature at about 415 degrees C. and the pressure at about 40 Torr in order to form said silicon passivation thin film.

4. The tungsten chemical vapor deposition method according to claim 1, wherein said silicon passivation thin film has a thickness of at least about 10 angstroms.

5. A tungsten chemical vapor deposition method, comprising the steps of:

preparing a wafer where a barrier layer is formed;

supplying silane gas from a top of said wafer and from a bottom of an edge portion of said wafer toward said wafer simultaneously, in order to form a silicon passivation thin film on the top surface and the edge portion of said wafer;

supplying a mixed gas including a tungsten fluoride gas and a silane gas from the top of said wafer toward said wafer, and at the same time supplying a silane gas from the bottom of the edge portion toward said wafer, in order to form a tungsten nucleation on the top surface of said wafer where said passivation thin film is formed; and supplying a mixed gas including a tungsten fluoride gas and a hydrogen gas from the top of said wafer toward said wafer, in order to deposit sufficiently thick tungsten on the surface of said wafer.

6. The tungsten chemical vapor deposition method according to claim 5, further comprising supplying the silane gas at a flow rate ranging from 30 to 50 SCCM for about 5 seconds in order to form said silicon passivation thin film.

7. The tungsten chemical vapor deposition method according to claim 5, wherein said silicon passivation thin film has a thickness of at least about 10 angstroms.

8. The tungsten chemical vapor deposition method according to claim 5, wherein, while supplying the silane gas in order to form said silicon passivation thin film, the temperature is maintained at about 415 degrees C. and the pressure is maintained at about 40 Torr.

9. The tungsten chemical vapor deposition method according to claim 5, further comprising supplying a tungsten fluoride gas at a flow rate ranging from 300 to 350 SCCM in order to form said tungsten nucleation.

10. The tungsten chemical vapor deposition method according to claim 5, wherein the deposited thickness of said tungsten is about 4,000 angstroms.

11. The tungsten chemical vapor deposition method according to claim 5, wherein said wafer is clamped with a ring clamp for preventing the tungsten fluoride gas from contacting directly with the edge portion.

12. The tungsten chemical vapor deposition method according to claim 5, wherein said barrier layer is a multi-layered structure of Ti/TiN.

13. A method for forming a tungsten plug in a semiconductor device, comprising the steps of:

forming a hole on an insulation layer on a wafer;

depositing a titanium thin film with a uniform thickness on the insulation layer;

depositing a titanium nitride film with a uniform thickness on said titanium thin film;

forming a silicon passivation thin film on said titanium nitride film by supplying silane gas to each of a top surface and an edge portion of the wafer deposited with said titanium nitride film;

forming a tungsten nucleation on the top surface of the wafer while supplying silane gas to each of the top surface and the edge part of the wafer where said silicon passivation film is formed; and depositing tungsten on the top surface of the wafer where said tungsten nucleation is formed, in order for said hole to be filled sufficiently.

14. The method for forming a tungsten plug of a semiconductor device according to claim 13, further comprising supplying the silane gas at a flow rate ranging from 30 to 50 SCCM for about 5 or 30 seconds in order to form said silicon passivation thin film.

15. The method for forming a tungsten plug of a semiconductor device according to claim 13, wherein said silicon passivation thin film has a thickness of at least about 10 angstroms.

16. The method for forming a tungsten plug of a semiconductor device according to claim 13, wherein, in supplying the silane gas in order to form said silicon passivation thin film, the temperature is maintained at about 415 degrees C. and the pressure is maintained at about 40 Torr.

17. The method for forming a tungsten plug of a semiconductor device according to claim 13, further comprising supplying a tungsten fluoride gas at a flow rate ranging from 300 to 350 SCCM in order to form said tungsten nucleation.

18. The method for forming a tungsten plug of a semiconductor device according to claim 13, wherein the deposited thickness of said tungsten is about 4,000 angstroms.

19. The method for forming a tungsten plug of a semiconductor device according to claim 13, wherein said wafer is clamped with a ring clamp for preventing the tungsten fluoride gas from contacting directly with the edge portion.

20. The method for forming a tungsten plug of a semiconductor device according to claim 13, wherein the surface of said deposited tungsten layer is polished flat by a CMP process.

* * * * *